United States Patent
Krymski et al.

(10) Patent No.: US 6,870,496 B2
(45) Date of Patent: Mar. 22, 2005

(54) LOW VOLTAGE ANALOG-TO-DIGITAL CONVERTERS WITH INTERNAL REFERENCE VOLTAGE AND OFFSET

(75) Inventors: Alexander I. Krymski, Montrose, CA (US); Kwang-Bo (Austin) Cho, Los Angeles, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/337,851

(22) Filed: Jan. 8, 2003

(65) Prior Publication Data

US 2004/0008134 A1 Jan. 15, 2004

Related U.S. Application Data

(60) Continuation of application No. 10/034,091, filed on Dec. 27, 2001, now Pat. No. 6,567,029, which is a division of application No. 09/538,043, filed on Mar. 29, 2000, now Pat. No. 6,476,751.

(51) Int. Cl.[7] ............................................... H03M 1/10
(52) U.S. Cl. ..................... 341/172; 341/118; 348/308
(58) Field of Search ............................. 341/150, 155, 341/172, 118, 120; 348/301, 308

(56) References Cited

U.S. PATENT DOCUMENTS

| | | | |
|---|---|---|---|
| 4,200,863 A | 4/1980 | Hodges et al. | |
| 4,301,477 A * | 11/1981 | Takemoto et al. | 348/308 |
| 4,517,549 A | 5/1985 | Tsukakoshi | |
| 4,709,225 A * | 11/1987 | Welland et al. | 341/121 |
| 5,581,252 A | 12/1996 | Thomas | |
| 5,600,322 A | 2/1997 | Garavan | |
| 5,606,320 A | 2/1997 | Kleks | |
| 5,621,409 A | 4/1997 | Cotter et al. | |
| 5,638,072 A * | 6/1997 | Van Auken et al. | 341/141 |
| 5,852,415 A * | 12/1998 | Cotter et al. | 341/120 |
| 5,877,715 A | 3/1999 | Gowda et al. | |
| 5,995,036 A | 11/1999 | Nise et al. | |
| 6,087,970 A * | 7/2000 | Panicacci | 341/172 |
| 6,100,837 A * | 8/2000 | Takeuchi | 341/161 |
| 6,115,066 A | 9/2000 | Gowda et al. | |
| 6,150,968 A * | 11/2000 | Tsay et al. | 341/139 |
| 6,222,175 B1 | 4/2001 | Krymski | |
| 6,353,401 B1 | 3/2002 | Aswell et al. | |

* cited by examiner

Primary Examiner—Howard L. Williams
(74) Attorney, Agent, or Firm—Dickstein Shapiro Morin & Oshinsky

(57) ABSTRACT

An A-to-D converter system having programmed reference signal levels using only supply signal provided by a power supply is disclosed. The converter system includes a comparator configured to provide comparison of an analog input signal with an adjustable reference level. The converter system also includes a logic circuit and an adjustable capacitor.

26 Claims, 7 Drawing Sheets

LOW VOLTAGE ANALOG-TO-DIGITAL CONVERTERS WITH INTERNAL REFERENCE VOLTAGE AND OFFSET

CROSS-REFERENCE TO RELATED APPLICATIONS

This application is a continuation of U.S. application Ser. No. 10/034,091, filed Dec. 27, 2001, now U.S. Pat. No. 6,567,029, which is a divisional of U.S. application Ser. No. 09/538,043, filed Mar. 29, 2000, now U.S. Pat. No. 6,476, 751.

GOVERNMENT SPONSORED RESEARCH

This invention was made with Government support under contract DAAH01-98-C-R184 awarded by the U.S. Army aviation and Missile Command. The Government has certain rights in the invention.

BACKGROUND

The present disclosure generally relates to analog-to-digital converters, and specifically to establishing internal reference voltage and offset in such converters.

In typical analog-to-digital (A-to-D) conversion, reference voltage levels are used to generate a digital representation of an analog input signal. Dynamic range/signal resolution is often maximized when the expected range of the analog input signal matches the reference voltage level.

FIG. 1 shows one type of A-to-D converter 100 that uses a technique known as successive approximation. The operation of this A-to-D converter 100 is analogous to weighing an unknown object on a laboratory balance scale as 1, ½, ¼, ⅛, . . . 1/n standard weight units. The largest weight is placed on the balance pan first; if it does not tip, the weight is left on and the next largest weight is added. If the balance does tip, the weight is removed and the next one added. The same procedure is used for the next largest weight and so on down to the smallest. After the n-th standard weight has been tried and a decision made, the weighing is finished. The total of the standard weights remaining on the balance is the closest possible approximation to the unknown weight. This weighing logic is implemented as a D-to-A converter 102 in FIG. 1.

One embodiment of the successive approximation A-to-D converter 200 is illustrated in FIG. 2. A bank of capacitors 202 and switches 204 implement the weighing logic 201 with successively smaller size capacitors. A capacitor of size $2^{n-1}*C$ represents the most-significant bit (MSB) while a capacitor of size C represents the least-significant bit (LSB) The value n is the number of binary bits in an A-to-D converter 200. Maximum capacitance provided at the input signal node 214 is $2^n-1)*C=C+ \ldots +2^{n-2}*C+2^{n-1}*C$. This is equivalent to a digital value of all ones. Therefore, the LSB voltage is $$V_{LSB} = \frac{V_{MAX}}{C_{MAX}} = \frac{V_{REF}}{(2^n - 1)*C}.$$

An input signal ($V_{IN}$) 206 is sampled onto the bank of capacitors 202 and a comparator 208. Initially, the bottom plates of the capacitors 202 are grounded. During the conversion process, the bottom plates of the capacitors 202 are successively connected to the reference voltage ($V_{REF}$) 210. Corresponding bits are derived and stored in latches 212.

A reference voltage level is generally adjusted and programmed to the input signal level. Since this reference voltage level is often adjusted to the full voltage swing of the input signal, the reference voltage must either be supplied to the A-to-D converter 200 from off-chip or generated on-chip using reference circuits.

SUMMARY

The present application defines an A-to-D converter system having programmed reference signal levels using only supply signal provided by a power supply.

The converter system includes a comparator configured to provide comparison of an analog input signal with an adjustable reference level. The converter system also includes a logic circuit and an adjustable capacitor.

The logic circuit is coupled to the comparator, and has successively smaller size capacitors. Each capacitor is connected to at least one switch. The switch is configured to successively connect each capacitor to different levels of the supply signal. The adjustable capacitor is also coupled to the comparator, and is configured to provide additional capacitance. The additional capacitance reduces full swing of the adjustable reference level to enable the logic circuit to operate with the supply signal.

The present application also defines a method of converting analog signal to digital signal. The method includes adjusting a reference capacitor at an input signal node to appropriately reduce full swing of a reference level. Conversion capacitors are selectively connected to a supply signal to program the reference level. The method also includes comparing an input signal to the programmed reference level, and reading a digital output value into latches if the comparison results in a match.

BRIEF DESCRIPTION OF THE DRAWINGS

Different aspects of the disclosure will be described in reference to the accompanying drawings wherein.

DETAILED DESCRIPTION

The present application defines an A-to-D converter system that provides an efficient solution to the problem of supplying the reference voltage. In one aspect, the solution considers implementation of the A-to-D converter in compact micro-power level circuits.

For example, an array of A-to-D converters is used in CMOS image sensors. These sensors can include active pixel sensors (APS) and charge-coupled devices (CCD). The image sensor is arranged into an array of column pixels and row pixels. Each pixel collects electrical charge when exposed to is light. Control signals provided to the pixels periodically enable the controllers to transfer the collected charge to the array of A-to-D converters. The collected charge is converted to digital data and stored in the column-parallel latches.

Since the available chip area and power is limited in column parallel circuits, it is advantageous to provide a substantially compact design where the reference voltage uses the existing supply voltage. Further, by adjusting the total capacitance of the binary-weighted conversion capacitors, the effective reference voltage can be changed.

Figure 1:
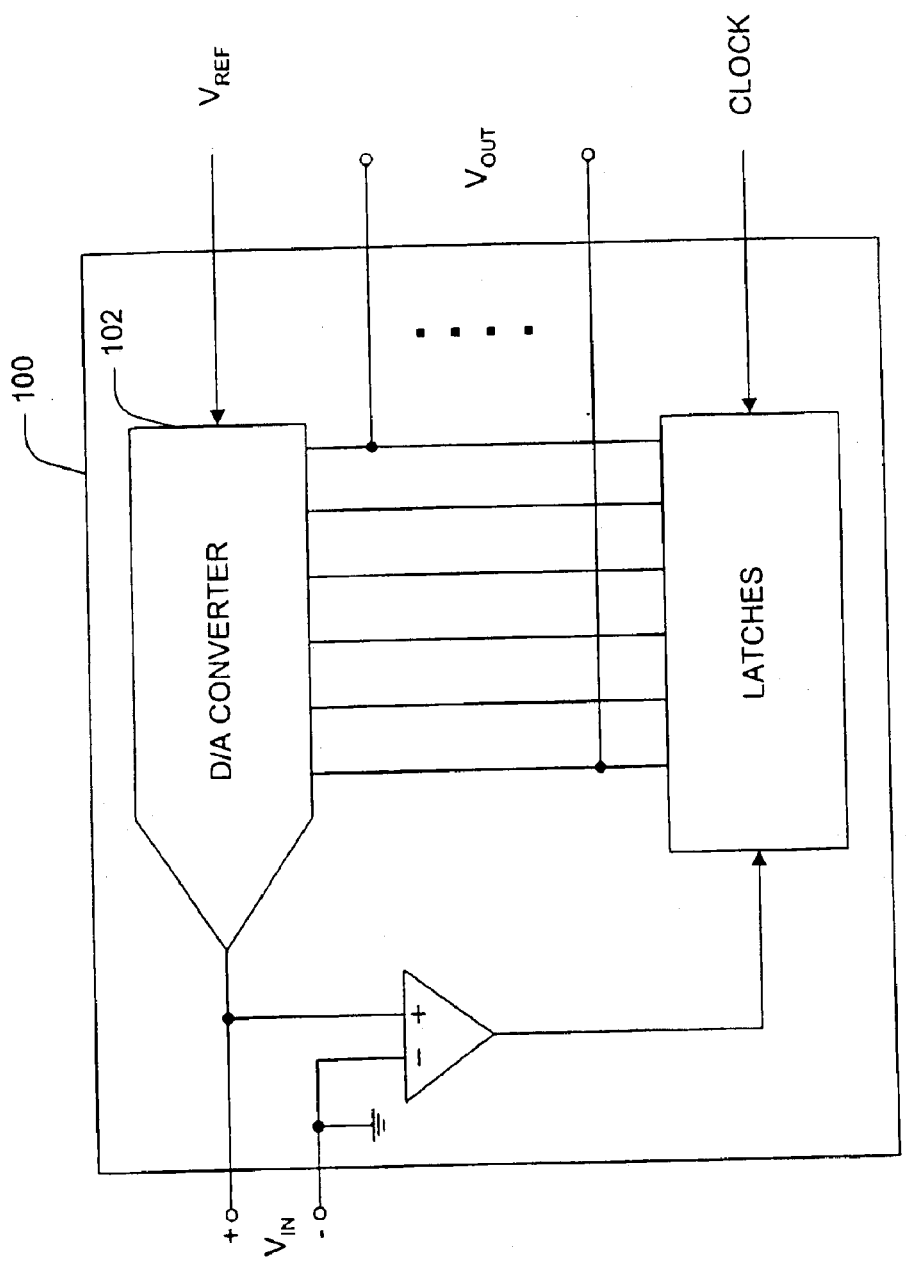
FIG. 1 is a block diagram of a successive approximation A-to-D converter.
Figure 2:
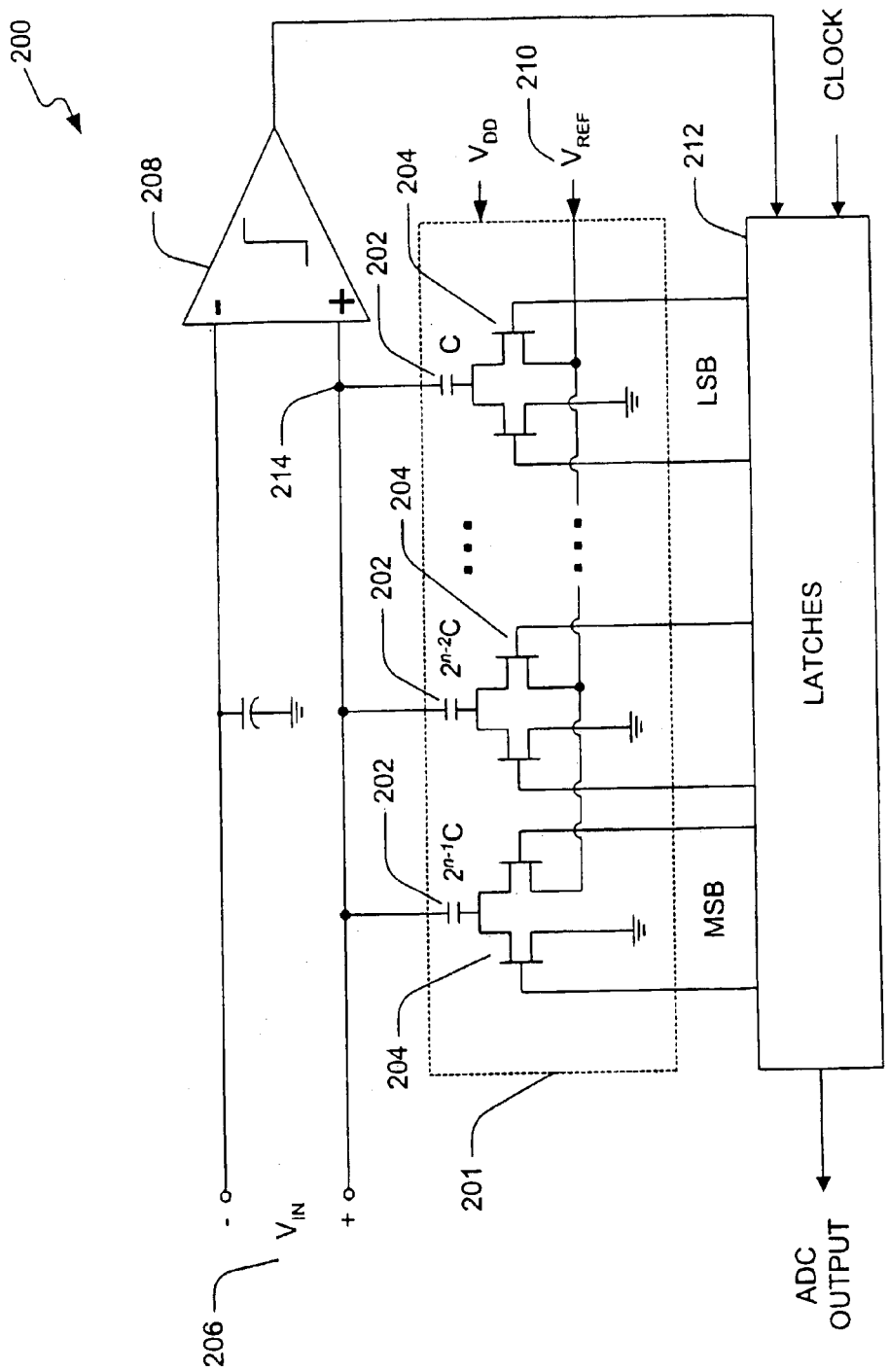
FIG. 2 is a detailed block diagram of a successive approximation A-to-D converter.
Figure 3:
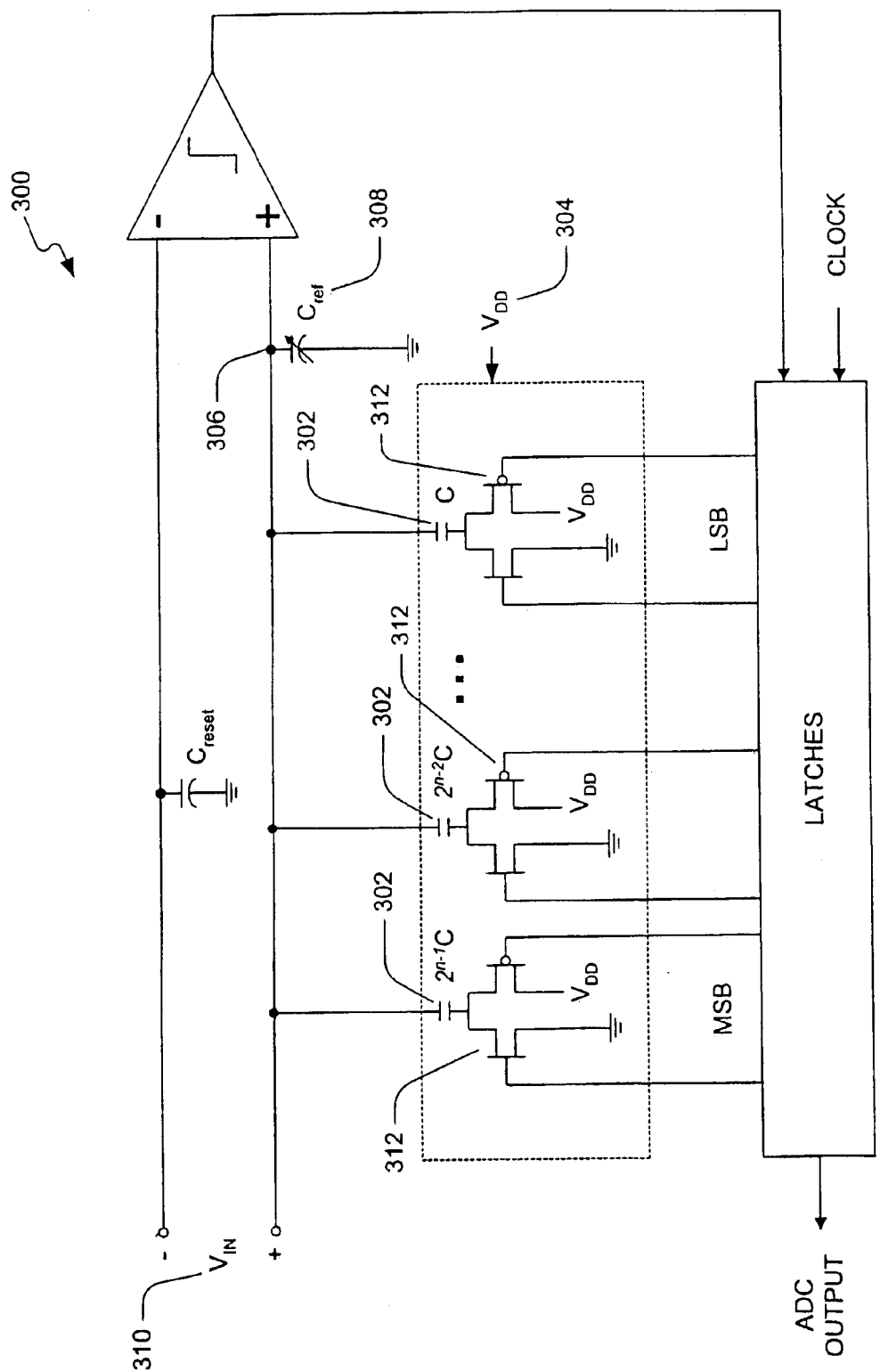
FIG. 3 is a schematic diagram of an A-to-D converter system according to one aspect.

A schematic diagram of an embodiment of the A-to-D converter system 300 is shown in FIG. 3. The converter system 300 eliminates the need for the internally-generated or externally-supplied reference voltage 210 by using the rail supply voltage ($V_{DD}$) 304. The converter system 300 allows the capacitors 302 to use the existing supply voltage 304 by providing an adjustable reference capacitor ($C_{REF}$) 308 at the positive input signal node 306. Initially, the bottom plates of the capacitors 302 are grounded. During the conversion process, the bottom plates of the capacitors 302 are successively connected to the supply voltage 304.

The adjustable reference capacitor 308 provides additional capacitance at the positive input signal node 306. Thus, the maximum capacitance at the positive input signal node 306 increases to $$2^n-1)*C+C_{REF} \qquad (2)$$

The least-significant bit (LSB) voltage is equal to $$V_{LSB} = \frac{V_{MAX}}{C_{MAX}} = \frac{V_{DD}}{(2^n-1)*C+C_{REF}}. \qquad (3)$$

In one example, if the value of $C_{REF}$ 308 is adjusted to equal the total capacitance $(2^n-1)*C$ of the conversion capacitors 302, the maximum capacitance at the positive input signal node 306 becomes $2*(2^n-1)*C$. Therefore, the effective reference level of the A-to-D converter 300 that is required to match the input signal swing 310 is reduced to one-half that of the conventional A-to-D converter 200.

Further, the actual capacitance value of $C_{REF}$ 308 can be adjusted to reduce the effective reference voltage level by any amount within some tolerance value.

In some embodiments, the metal-oxide silicon field-effect transistor (MOSFET) switches 312 are appropriately modified for a low-voltage application when the supply voltage 304 is used in place of the internally-generated or externally-supplied reference voltage 210. For example, when the supply voltage 304 is about 1.2 volts and the threshold voltages of the switches 312 are more than 0.6 volts, the n-channel switches cannot effectively pass voltages close to one-half of the supply voltage 304. Therefore, the p-channel MOSFET switches 312 are used to connect the bottom plates of the conversion capacitors 302 to the supply voltage 304.

Figure 4:
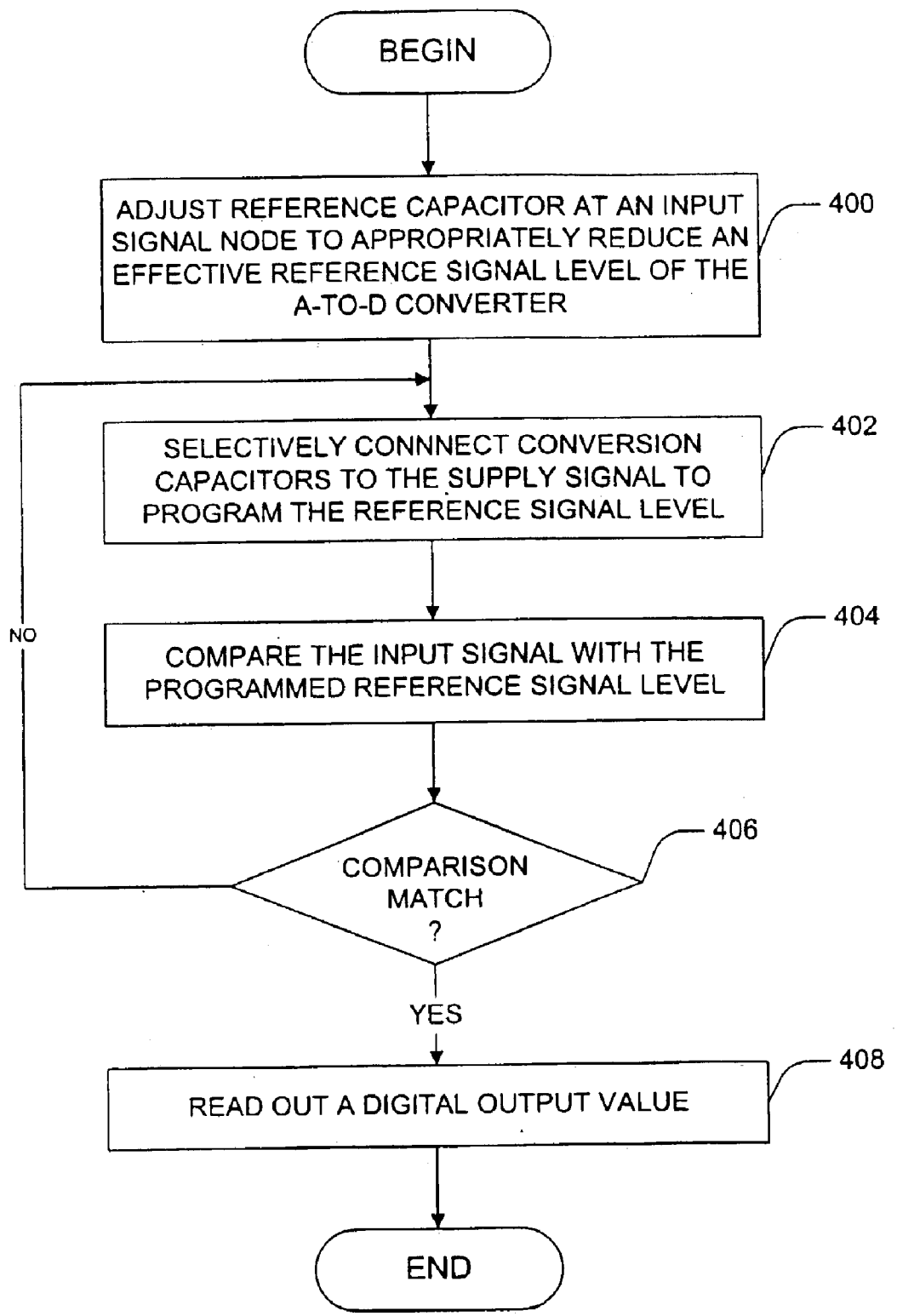
FIG. 4 is a flowchart of an A-to-D conversion process according to another aspect.

FIG. 4 shows a flowchart of an A-to-D conversion process. According to an illustrated embodiment, the conversion process uses the supply voltage instead of the externally-supplied or internally-generated reference voltage.

At step 400, a reference capacitor at the positive input signal node is adjusted to appropriately reduce an effective reference signal level. Once the reference capacitance is adjusted to some optimum value, the conversion capacitors are selectively connected to the supply voltage at step 402. The selective connection programs the reference signal level. At step 404, the input signal is compared to the programmed reference signal level. If the comparison match is found (step 406), a digital output value is read out from the latches at step 408.

Although the above-described solution slightly increases the dynamic power consumption in an A-to-D converter, the solution reduces the overall system power consumption. This solution is especially beneficial to low-voltage, low-power CMOS imagers because the supply voltage (approximately 1.2 to 1.5 volts) is close to the required reference voltage (approximately 1.0 volt). Other advantages include overall circuit simplification and no decoupling capacitors that are required to stabilize the reference voltage.

Figure 5:
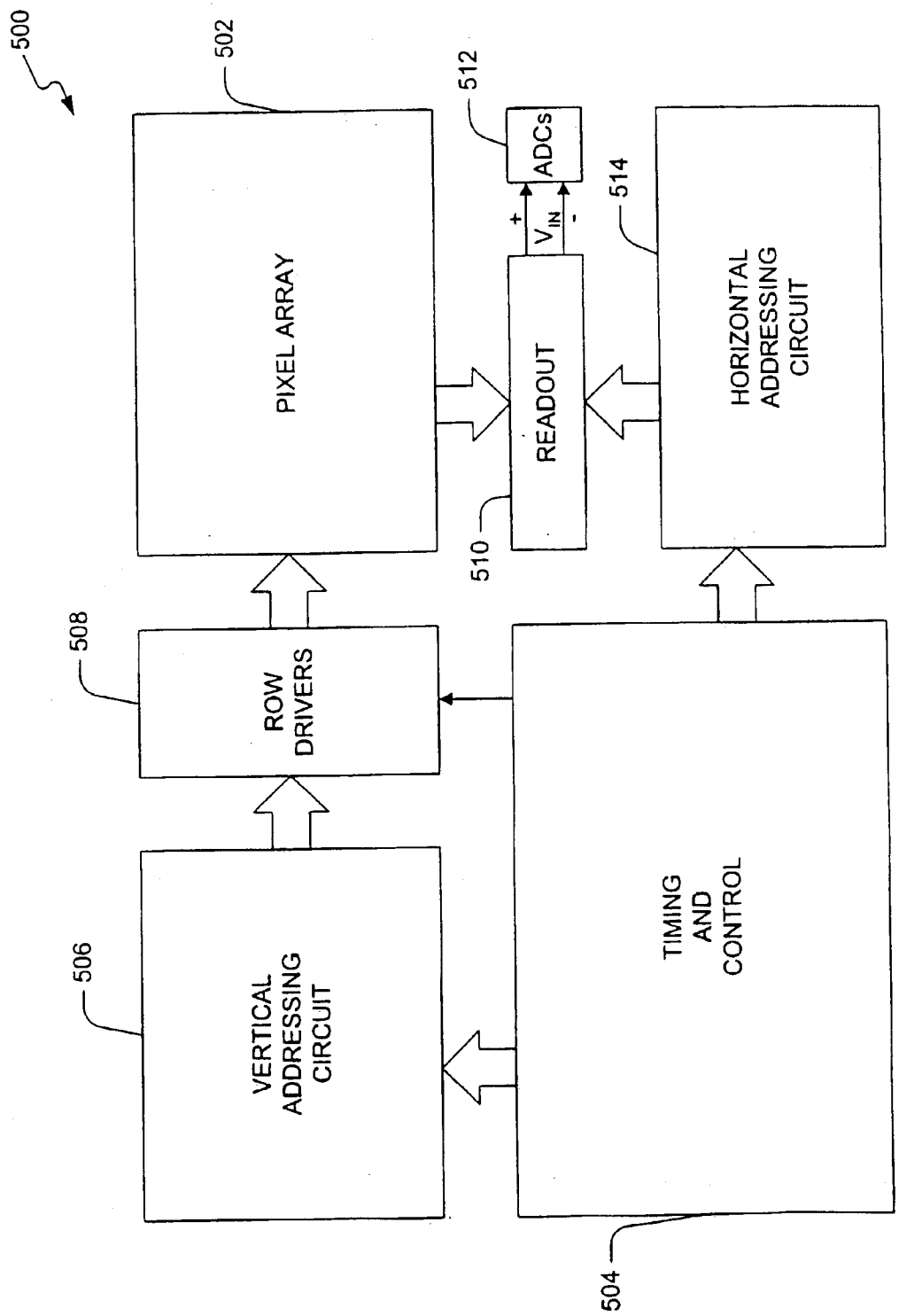
FIG. 5 shows an example of a CMOS image sensor integrated circuit having the A-to-D converter of the present invention.

FIG. 5 shows an example of a CMOS image sensor integrated circuit chip 500. The chip 500 includes an array of active pixel sensors 502 and a controller 504. The controller 504 provides timing and control signals to enable read out of signals stored in the pixels. For some embodiments, arrays can have dimensions of 128×128 or some larger number of pixels. However, in general, the size of the array 502 will depend on the particular implementation. The image array 502 is read out a row at a time using a column-parallel readout architecture. The controller 504 selects a particular row of pixels in the array 502 by controlling the operation of the vertical addressing circuit 506 and row drivers 508. Charge signals stored in the selected row of pixels are provided to a readout circuit 510. The pixels read from each of the columns can be read out sequentially using a horizontal addressing circuit 514. Differential pixel signals ($V_{in}^+$, $V_{in}^-$) are provided at the output of the readout circuit 510. The differential pixel signals are converted to digital values by an A-to-D converter 512 having a reference capacitor. This capacitor can be used to reduce the effective capacitance at the positive input signal node.

Figure 6:
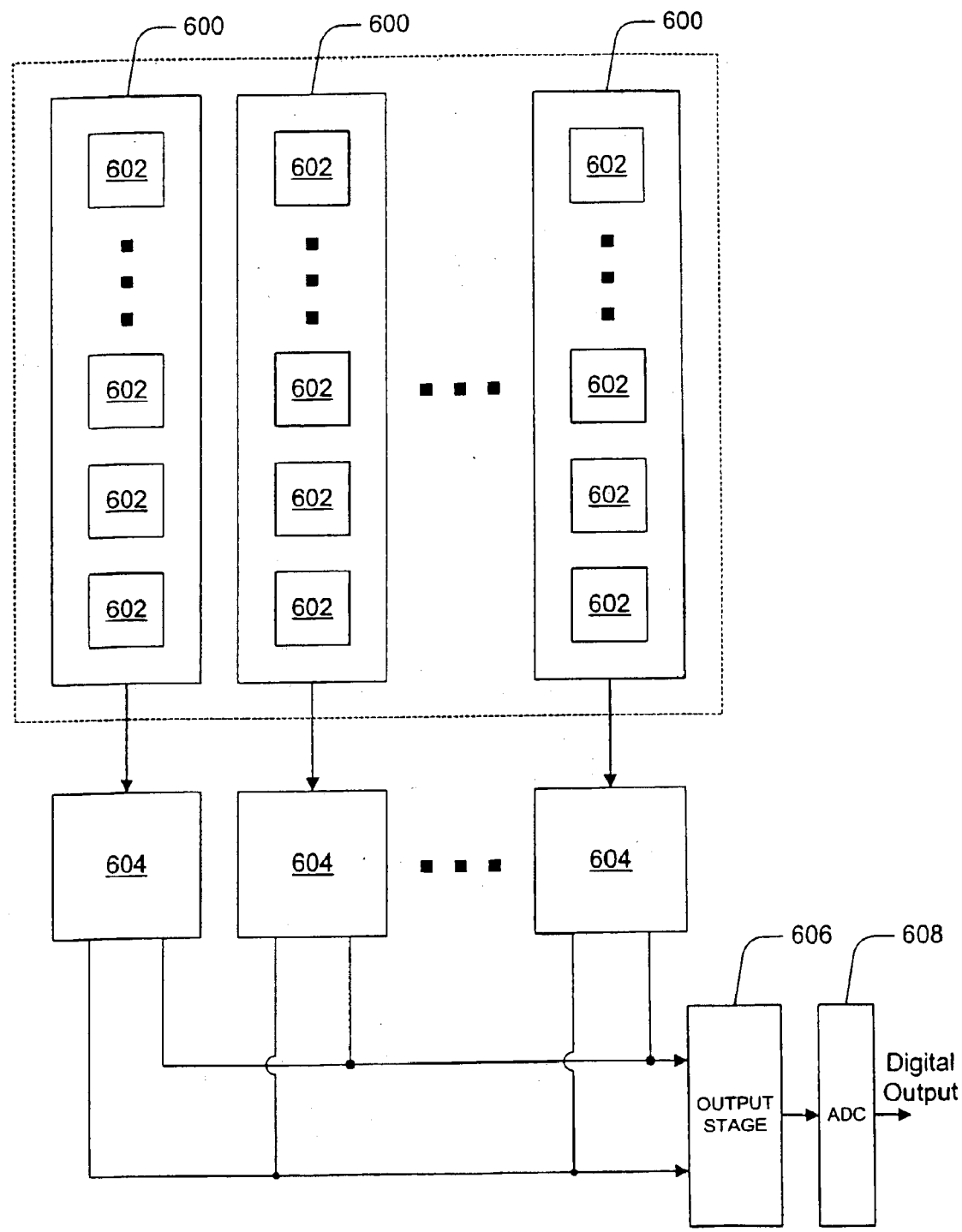
FIG. 6 is a block diagram of a pixel array and associated readout circuit and an A-to-D converter.

As shown in FIG. 6, the array 502 includes multiple columns 600 of CMOS active pixel sensors 602. Each column includes multiple rows of sensors 602. Signals from the active pixel sensors 602 in a particular column can be read out to a readout circuit 604 associated with that column. Signals stored in the readout circuits 604 can be read to an output stage 606. This output stage 606 is common to the entire array of pixels 502. The analog output signals are is sent to a differential A-to-D converter 608.

Figure 7:
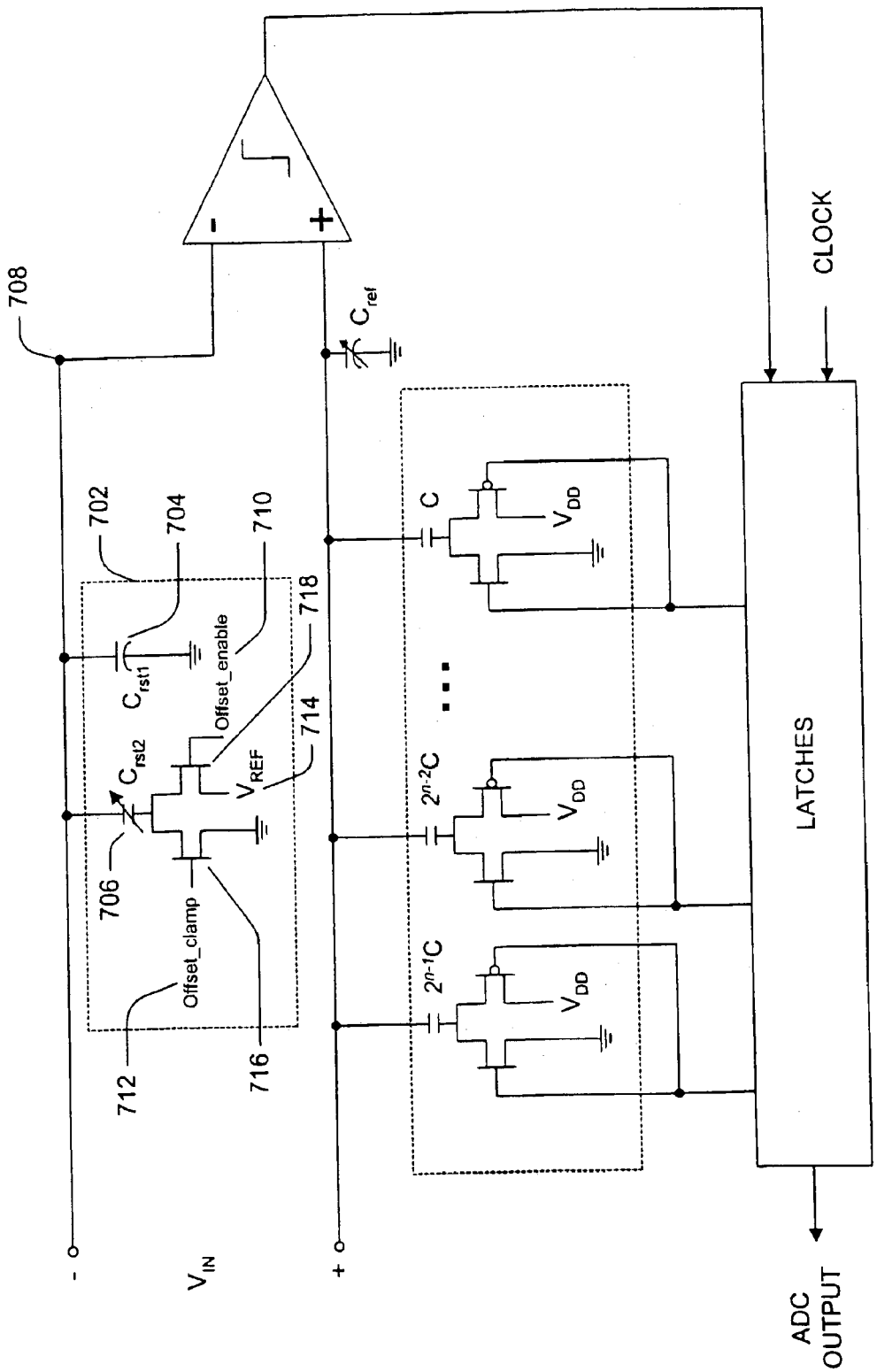
FIG. 7 is a schematic diagram of an A-to-D converter system according to a further aspect of the present invention.

A further aspect of the A-to-D converter 700 is shown in FIG. 7. An offset signal is provided at the negative input signal node. In one embodiment, the offset signal is generated by an offset adjustment circuit 702 to remove dark signals appearing on the pixel array 502. In other embodiments, the offset signal electronically increases the brightness of the image or compensates for some artificial offset added in the signal processing chain in the readout circuit 510.

The offset adjustment circuit 702 includes two capacitors 704, 706. A larger-valued capacitor 704 is connected between the negative input signal node 708 and ground. A smaller-valued capacitor is, in general, a variable capacitor 706. The top plate of the variable capacitor 706 is connected to the negative input signal node 708. The bottom plate of the variable capacitor 706 is connected either to a reference voltage or to ground.

When a positive offset is desired during sampling, an Offset Enable signal 710 is asserted. Otherwise, if a negative offset is desired during sampling, an Offset Clamp signal 712 is asserted. This signal is then de-asserted to turn the clamp switch 716 off and turn the enable switch 718 on. During conversion, if a positive offset is desired, an Offset Clamp signal 712 is asserted.

Other embodiments and variations are possible. For example, a variable offset can be achieved by either using the variable capacitor 706 or a variable reference voltage 714. Further, the reset capacitor 704 can be omitted if the offset signal is relatively large compared to the full input voltage swing. Moreover, all references to voltages are for illustrative purposes only. The term "voltage" can be replaced with "current", "power", or "signal" where appropriate.

All these are intended to be encompassed by the following claims.

What is claimed is:

1. An A-to-D converter, comprising:
   a comparator circuit configured to compare a first signal provided on a first signal line to a second signal provided on a second signal line;
   an offset adjustment circuit coupled to one of said first or second signal lines for providing offset compensation; and
   a logic circuit coupled to an other of said first or second lines for selectively coupling a plurality of capacitors to said other of said first or second signal lines.

2. The A-to-D converter of claim 1, wherein said offset adjustment circuit further comprises:
   a capacitor coupled to one of said first or second signal lines.

3. The A-to-D converter of claim 2, wherein said capacitor is a variable capacitor.

4. The A-to-D converter of claim 2, wherein said capacitor is switchably coupled to a reference voltage for providing a positive offset.

5. The A-to-D converter of claim 4, wherein said capacitor is switchably coupled to ground for providing a negative offset.

6. The A-to-D converter of claim 1, wherein said logic circuit further comprises: an adjustable capacitor coupled between said other of said first or second signal lines and a supply signal, said adjustable capacitor configured to provide additional capacitance, said additional capacitance adjustable to change a full swing level of an adjustable reference level, such that the change enables said logic circuit to operate with said supply signal.

7. An A-to-D converter, comprising:
   a comparator circuit configured to compare a negative input signal provided on a negative signal line to a positive input signal provided on a positive signal line;
   an offset adjustment circuit coupled to negative input signal line for providing offset compensation; and
   a logic circuit coupled to said positive signal line for selectively coupling a capacitor to said positive signal line.

8. The A-to-D converter of claim 7, wherein said offset adjustment circuit further comprises:
   a second capacitor, wherein one side of said second capacitor is coupled to said negative signal line.

9. The A-to-D converter of claim 8, wherein said second capacitor is a variable capacitor.

10. The A-to-D converter of claim 8, wherein the other side of said second capacitor is switchably coupled to a reference voltage for providing a positive offset.

11. The A-to-D converter of claim 10, wherein the other side of said second capacitor is switchably coupled to ground for providing a negative offset.

12. The A-to-D converter of claim 11, wherein said offset adjustment circuit further comprises:
   a third capacitor for providing a reset value, wherein one side of said third capacitor is coupled to said negative signal line and the other side of said third capacitor is coupled to ground.

13. The A-to-D converter of claim 7, wherein said logic circuit further comprises: an adjustable capacitor coupled between said other of said first or second signal lines and a supply signal, said adjustable capacitor configured to provide additional capacitance, said additional capacitance adjustable to change a full swing level of an adjustable reference level, such that the change enables said logic circuit to operate with said supply signal.

14. A CMOS image sensor, comprising:
    a pixel array;
    an A-to-D converter for converting analog signals received from said pixel array to digital signals, said converter coupled to said pixel array, said converter comprising:
      a comparator circuit configured to compare a first signal provided on a first signal line to a second signal provided on a second signal line;
      an offset adjustment circuit coupled to one of said first or second signal lines for providing offset compensation; and
      a logic circuit coupled to an other of said first or second lines for selectively coupling a plurality of capacitors to said other of said first or second signal lines.

15. The image sensor of claim 14, wherein said offset adjustment circuit further comprises:
    a capacitor coupled to one of said first or second signal lines.

16. The image sensor of claim 15, wherein said capacitor is switchably coupled to a reference voltage for providing a positive offset.

17. The image sensor of claim 16, wherein said capacitor is switchably coupled to ground for providing a negative offset.

18. The sensor of claim 14, wherein said logic circuit further comprises: an adjustable capacitor coupled between said other of said first or second signal lines and a supply signal, said adjustable capacitor configured to provide additional capacitance, said additional capacitance adjustable to change a full swing level of an adjustable reference level, such that the change enables said logic circuit to operate with said supply signal.

19. A CMOS image sensor, comprising:
    a pixel array;
    an A-to-D converter for converting analog signals received from said pixel array to digital signals, said converter coupled to said pixel array, said converter comprising:
      a comparator circuit configured to compare a negative input signal provided on a negative signal line to a positive input signal provided on a positive signal line;
      an offset adjustment circuit coupled to negative input signal line for providing offset compensation; and
      a logic circuit coupled to said positive signal line for selectively coupling a capacitor to said positive signal line.

20. The image sensor of claim 19, wherein said offset adjustment circuit further comprises:
    a second capacitor, wherein one side of said second capacitor is coupled to said negative signal line.

21. The image sensor of claim 20, wherein the other side of said second capacitor is switchably coupled to a reference voltage for providing a positive offset.

22. The image sensor of claim 21, wherein the other side of said second capacitor is switchably coupled to ground for providing a negative offset.

23. The image sensor of claim 20, wherein said offset adjustment circuit further comprises:

a third capacitor for providing a reset value, wherein one side of said third capacitor is coupled to said negative signal line and the other side of said third capacitor is coupled to ground.

24. The A-to-D converter of claim 19, wherein said logic circuit further comprises: an adjustable capacitor coupled between said other of said first or second signal lines and a supply signal, said adjustable capacitor configured to provide additional capacitance, said additional capacitance adjustable to change a full swing level of an adjustable reference level, such that the change enables said logic circuit to operate with said supply signal.

25. A CMOS image sensor, comprising:

a power supply to provide a supply signal;

a pixel array having a plurality of pixels;

a controller to provide timing and control signals, said controller enabling readout of signals stored in the pixels; a readout circuit to sequentially read said signals stored in the pixels; and an A-to-D converter configured to convert said signals stored in the pixels into digital values, said converter including a variable capacitor configured to reduce a full swing of an adjustable reference level, said reduction enabling operation of said A-to-D converter with said supply signal.

26. The image sensor of claim 25, wherein said A-to-D converter includes:

a comparator configured to compare an analog input signal with said adjustable reference level generated from said supply signal;

a logic circuit coupled to said comparator, said logic circuit having successively smaller size capacitors, each capacitor connected to at least one switch, said at least one switch configured to successively connect said each capacitor to different levels of said supply signal; and an adjustable capacitor coupled to said comparator, said capacitor configured to provide additional capacitance, said additional capacitance reducing full swing of said adjustable reference level, such that the reduction enables said logic circuit to operate with said supply signal.

\* \* \* \* \*